United States Patent
Crouse et al.

(10) Patent No.: US 11,741,375 B2
(45) Date of Patent: Aug. 29, 2023

(54) CAPTURING THE GLOBAL STRUCTURE OF LOGICAL FORMULAE WITH GRAPH LONG SHORT-TERM MEMORY

(71) Applicant: International Business Machines Corporation, Armonk, NY (US)

(72) Inventors: Maxwell Crouse, Fishers, IN (US); Ibrahim Abdelaziz, Tarrytown, NY (US); Cristina Cornelio, White Plains, NY (US); Veronika Thost, Cambridge, MA (US); Lingfei Wu, Elmsford, NY (US); Bassem Makni, Bellevue, WA (US); Kavitha Srinivas, Rye, NY (US); Achille Belly Fokoue-Nkoutche, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 791 days.

(21) Appl. No.: 16/685,031

(22) Filed: Nov. 15, 2019

(65) Prior Publication Data

US 2021/0150373 A1  May 20, 2021

(51) Int. Cl.
*G06N 5/01* (2023.01)
*G06N 3/045* (2023.01)
(Continued)

(52) U.S. Cl.
CPC .............. *G06N 5/013* (2023.01); *G06N 3/044* (2023.01); *G06N 3/045* (2023.01); *G06N 3/063* (2013.01); *G06F 30/33* (2020.01)

(58) Field of Classification Search
CPC .... G06N 5/006; G06N 3/0445; G06N 3/0454; G06N 3/063; G06F 30/33
See application file for complete search history.

(56) References Cited

U.S. PATENT DOCUMENTS 6,385,765 B1    5/2002  Cleaveland et al.
8,046,202 B1 *  10/2011 Yang .................. G06F 8/20
                                                    717/136
(Continued)

FOREIGN PATENT DOCUMENTS

CN    107292464 A    10/2017
CN    109376864 A     2/2019
(Continued)

OTHER PUBLICATIONS

Evans et al., Can neural networks understand logical entailment?, 2018, 15 pages arXiv preprint arXiv:1802.08535.
(Continued)

*Primary Examiner* — Abderrahim Merouan
(74) *Attorney, Agent, or Firm* — Caleb Wilkes; Otterstedt & Kammer PLLC

(57) ABSTRACT

Generate, from a logical formula, a directed acyclic graph having a plurality of nodes and a plurality of edges. Assign an initial embedding to each mode and edge, to one of a plurality of layers. Compute a plurality of initial node states by using feed-forward networks, and construct cross-dependent embeddings between conjecture node embeddings and premise node embeddings. Topologically sort the DAG with the initial embeddings and node states. Beginning from a lowest rank, compute layer-by-layer embedding updates for each of the plurality of layers until a root is reached. Assign the embedding update for the root node as a final embedding for the DAG. Provide the final embedding for the DAG as input to a machine learning system, and carry out the automatic theorem proving with same.

25 Claims, 14 Drawing Sheets

DAG FORM OF THE FORMULA
$\forall A, B, C. (p(A) \wedge q(B, f(A)) \wedge q(C, f(A))) \Rightarrow r(A, B)$

(51) Int. Cl.
    G06F 30/33    (2020.01)
    G06N 3/063    (2023.01)
    G06N 3/044    (2023.01)

(56) References Cited

U.S. PATENT DOCUMENTS

| | | | |
|---|---|---|---|
| 2015/0074031 A1 | 3/2015 | Massie | |
| 2017/0161625 A1* | 6/2017 | Jannson | G06N 7/005 |
| 2021/0150373 A1* | 5/2021 | Crouse | G06N 3/0454 |
| 2021/0295169 A1* | 9/2021 | Sikka | G06V 10/764 |

FOREIGN PATENT DOCUMENTS

| | | |
|---|---|---|
| EP | 3062175 B1 | 8/2016 |
| JP | 2014081905 A | 5/2014 |
| WO | WO2015139755 A1 | 9/2015 |

OTHER PUBLICATIONS

Huang et al., Gamepad: A learning environment for theorem proving, 2018, 12 pages arXiv preprint arXiv:1806.00608.
Loos et al., Deep network guided proof search, 2017, 20 pages arXiv preprint arXiv:1701.06972.
Paliwal et al., Graph representations for higher-order logic and theorem proving, 2019, 9 pages arXiv preprint arXiv:1905.10006.
Wang et al., Premise selection for theorem proving by deep graph embedding, 2017, Advances in Neural Information Processing Systems, pp. 2786-2796.
Wikipedia—Handbook of Automated Reasoning, downloaded Dec. 17, 2019, 3 pages https://en.wikipedia.org/wiki/Handbook_of_Automated_Reasoning.
Mell et al., The NIST Definition of Cloud Computing, NIST Special Publication 800-145, Sep. 2011, cover, pp. i-iii and 1-3.
Tai et al., Improved Semantic Representations From Tree-Structured Long Short-Term Memory Networks, 2015, 11 pages https://arxiv.org/abs/1503.00075.
Hochreiter et al., Long Short-Term Memory, Neural Computation 9(8): 1735-1780, 1997 http://citeseerx.ist.psu.edu/viewdoc/download?doi=10.1.1.676.4320&rep=rep1&type=pdf.
Alama et al., Premise selection for mathematics by corpus analysis and kernel methods, Journal of Automated Reasoning 52, No. 2 (2014): 191-213 https://arxiv.org/pdf/1108.3446.pdf.
Bansal et al., Holist: An environment for machine learning of higher-order theorem proving (extended version), 2019 arXiv preprint arXiv:1904.03241.
Battaglia et al., Relational inductive biases, deep learning, and graph networks, 2018, 40 pages arXiv preprint arXiv:1806.01261.
Bronstein et al., Geometric deep learning: going beyond euclidean data, IEEE Signal Processing Magazine 34(4):18-42, 2017.
Gilmer et al., Neural message passing for quantum chemistry, In Proceedings of the 34th International Conference on Machine Learning—vol. 70, 1263-1272. JMLR.org, 2017.
Grabowski et al., Mizar in a nutshell. Journal of Formalized Reasoning 3(2):153-245. 2010.
Hoder et al., Sine qua non for large theory reasoning, In International Conference on Automated Deduction, 299-314, 2011, Springer.
Ioffe et al., Batch normalization: Accelerating deep network training by reducing internal covariate shift, 2015, 11 pages arXiv preprint arXiv:1502.03167.
Irving et al., Deepmath—deep sequence models for premise selection. In Advances in Neural Information Processing Systems, 2235-2243.
Kaliszyk Holstep: A machine learning dataset for higher-order logic theorem proving, 2017, 12 pages arXiv preprint arXiv:1703.00426.
Kingma et al., 2014. Adam: A method for stochastic optimization, 2014, 15 pages arXiv preprint arXiv:1412.6980.
Kucik et al., Premise selection with neural networks and distributed representation of features, 2018, 10 pages arXiv preprint arXiv:1807.10268.
Matuszek et al., An introduction to the syntax and content of cyc, UMBC Computer Science and Electrical Engineering Department Collection, 2006, 6 pages.
Paszke et al., Automatic differentiation in pytorch, 31st Conference on Neural Information Processing Systems (NIPS 2017), 4 pages https://openreview.net/pdf?id=BJJsrmfCZ.
Pease et al., , The suggested upper merged ontology: A large ontology for the semantic web and its applications. In Working notes of the AAAI-2002 workshop on ontologies and the semantic web, vol. 28, 7-10.
Peng et al., Cross-sentence n-ary relation extraction with graph Lstms. Transactions of the Association for Computational Linguistics 5:101-115, 2017.
Ramachandran et al., First-orderized researchcyc: Expressivity and efficiency in a common-sense ontology. In AAAI workshop on contexts and ontologies: theory, practice and applications, 2005, 8 pages.
Sekar et al., Term indexing, handbook of automated reasoning, 2001.
Sutcliffe, The tptp problem library and associated infrastructure. Journal of Automated Reasoning 43(4):337, 2009.
Wu et al., A comprehensive survey on graph neural networks, 2019, 22 pages arXiv preprint arXiv:1901.00596.
Logical formula—Encyclopedia of Mathematics, downloaded Mar. 1, 2023 from https://encyclopediaofmath.org/wiki/Logical_formula, 1 page.
Microsoft Press, Computer Dictionary, Third Edition, 1997, "software" cover, p. 441.
Conjecture—Wikipedia, downloaded Feb. 1, 2023 from https://en.wikipedia.org/wiki/Conjecture, 9 pages.
Premise—Wikipedia, downloaded Feb. 1, 2023 from https://en.wikipedia.org/wiki/Premise, 3 pages.
Microsoft Press, Computer Dictionary, Third Edition, 1997, "specification" cover, p. 444.

\* cited by examiner $$m_v^t = \sum_{w \in \mathcal{N}(v)} F_M^t([s_v^{t-1}; s_w^{t-1}; h_{e_{vw}}])$$
$$s_v^t = F_A^t([s_v^{t-1}; m_v^t])$$

FIG. 5

$$i_v = \sigma\left(W_i s_v^T + \sum_{w \in \mathcal{P}(v)} U_i[h_w; h_{e_{vw}}] + b_i\right)$$
$$o_v = \sigma\left(W_o s_v^T + \sum_{w \in \mathcal{P}(v)} U_o[h_w; h_{e_{vw}}] + b_o\right)$$
$$\hat{c}_v = \tanh\left(W_c s_v^T + \sum_{w \in \mathcal{P}(v)} U_c[h_w; h_{e_{vw}}] + b_c\right)$$
$$f_{vw} = \sigma\left(W_f s_v^T + U_f[h_w; h_{e_{vw}}] + b_f\right)$$
$$c_v = i_v \odot \hat{c}_v + \sum_{w \in \mathcal{P}(v)} f_{vw} \odot c_w$$
$$h_v = o_v \odot \tanh(c_v)$$

Results for MIZAR premise-selection (T indicates number of MPNN message-passing rounds)

| Model | T | Accuracy |
|---|---|---|
| FormulaNet (2017) | 3 | 71.4% |
| MPNN | 0 | 72.2% |
| | 1 | 72.4% |
| | 2 | 72.7% |
| MPNN-GLSTM | 0 | 72.8% |
| | 1 | 72.4% |
| | 2 | 72.2% |
| Dep-MPNN-GLSTM | 0 | 75.5% |
| | 1 | 74.7% |
| | 2 | 74.8% |

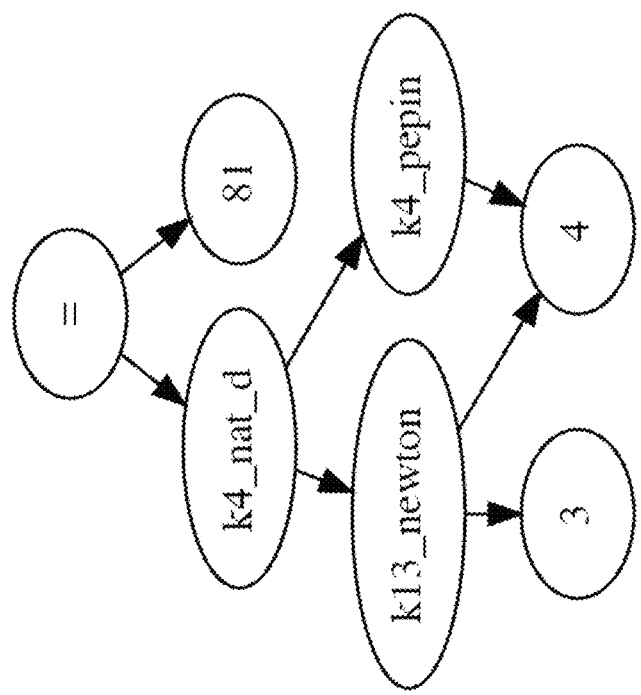
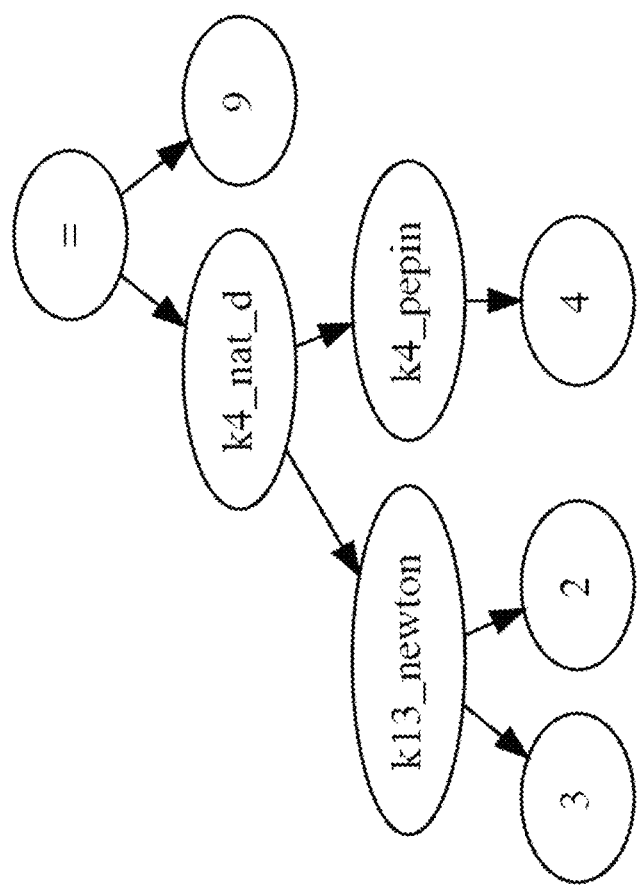
FIG. 11

Results for HolStep proof step classification ($T$ indicates number of MPNN message-passing rounds)

| Model | $T$ | Accuracy |
|---|---|---|
| DeepWalk (2014) | - | 61.8 % |
| CNN-LSTM (2017) | - | 83.0 % |
| CNN (2017) | - | 82.0 % |
| FormulaNet (2017) | 3 | 90.3 % |
| MPNN | 0 | 77.2% |
| | 1 | 89.7% |
| | 2 | 90.0% |
| MPNN-GLSTM | 0 | 89.5% |
| | 1 | 90.7% |
| | 2 | 90.9% |
| Dep-MPNN-GLSTM | 0 | 89.5% |
| | 1 | 90.5% |
| | 2 | % |

FIG. 13

CAPTURING THE GLOBAL STRUCTURE OF LOGICAL FORMULAE WITH GRAPH LONG SHORT-TERM MEMORY

BACKGROUND

The present invention relates to the electrical, electronic, and computer arts, and more specifically, to machine learning, computer reasoning, and the like.

Theorem proving is the task of proving a conjecture C from a collection of axioms A with a set of inference rules I. Theorem proving can be formulated as a search problem. Current automated theorem provers typically struggle when given large collections of axioms; there is a tendency to "get lost" in irrelevant regions of proof search-space.

Long short-term memory (LSTM) is an artificial recurrent neural network (RNN) architecture used in the field of deep learning; unlike standard feed-forward neural networks, LSTM has feedback connections. LSTM can not only process single data points (such as images), but also entire sequences of data (such as speech or video). For example, LSTM is applicable to tasks such as unsegmented, connected handwriting recognition or speech recognition.

SUMMARY

Principles of the invention provide techniques for capturing the global structure of logical formulae with graph long short-term memory. In one aspect, an exemplary method of improving performance of a machine learning system carrying out automatic theorem proving by narrowing a search space is provided; the machine learning system is implemented on at least one hardware processor. The method includes the steps of generating, from a logical formula, a directed acyclic graph having a plurality of nodes and a plurality of edges; assigning an initial embedding to each of the nodes and each of the edges, wherein the initial embeddings assign each of the nodes to one of a plurality of layers and include conjecture node embeddings and premise node embeddings; computing a plurality of initial node states for the nodes by using feed-forward networks; and constructing cross-dependent embeddings between the conjecture node embeddings and the premise node embeddings. The method further includes topologically sorting the directed acyclic graph with the initial embeddings and the initial node states; beginning from a lowest rank obtained in the topologically sorting step, computing layer-by-layer embedding updates for each of the plurality of layers until a root one of the nodes is reached; and assigning the embedding update for the root node as a final embedding for the directed acyclic graph. The final embedding for the directed acyclic graph is provided as input to the machine learning system, which carries out the automatic theorem proving based on the input.

In another aspect, a machine learning system carries out automatic theorem proving. The system includes a memory; and at least one processor, coupled to the memory, and operative to improve performance of the machine learning system carrying out automatic theorem proving by narrowing the search space. The at least one processor implements an automatic theorem prover. The at least one processor generates, from a logical formula, a directed acyclic graph having a plurality of nodes and a plurality of edges; assigns an initial embedding to each of the nodes and each of the edges, wherein the initial embeddings assign each of the nodes to one of a plurality of layers and include conjecture node embeddings and premise node embeddings; computes a plurality of initial node states for the nodes by using feed-forward networks; and constructs cross-dependent embeddings between the conjecture node embeddings and the premise node embeddings. The at least one processor further topologically sorts the directed acyclic graph with the initial embeddings and the initial node states; beginning from a lowest rank obtained in the topologically sorting step, computes layer-by-layer embedding updates for each of the plurality of layers until a root one of the nodes is reached; and assigns the embedding update for the root node as a final embedding for the directed acyclic graph. The final embedding for the directed acyclic graph is provided as input to the automatic theorem prover; and the automatic theorem proving is carried out with the automatic theorem prover based on the input.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments provide one or more of:

overcoming the inability of "vanilla" GNNs to embed more than just the local neighborhoods of nodes by using an LSTM-based method that computes the embedding of each node to be functions of its dependencies in the DAG form of the given formula;

overcoming the limitations of tree LSTMs by capturing the global graph-structure through the reification of duplicate sub-expressions and variables, thus keeping the relevant contextual information surrounding each node (e.g. a variable with all the terms it appears in) in close proximity to that node (rather than in distinct regions of a tree representation);

an accurate premise selection algorithm in accordance with one or more embodiments cuts the search space, allowing a theorem prover to be faster, thus reducing the amount of CPU time required and increasing computer performance—given a small set of premises, it allows the theorem prover to terminate in a reasonable time (while it would take years or more on the original problem).

These and other features and advantages of the present invention will become apparent from the following detailed

BRIEF DESCRIPTION OF THE DRAWINGS

FIG. 5 presents equations for a message-passing phase in an exemplary method, according to an aspect of the invention;

FIG. 6 presents equations for determining node states in an exemplary method, according to an aspect of the invention;

FIG. 9 is a table showing non-limiting experimental results for MIZAR premise-selection, achieved with an exemplary embodiment of the invention;

FIG. 11 shows the DAG representation of a premise (left) not entailing a hypothesis (right) in accordance with an aspect of the invention;

FIG. 13 is a table showing non-limiting experimental results for HolStep proof step classification, achieved with an exemplary embodiment of the invention;

DETAILED DESCRIPTION

Figure 1:
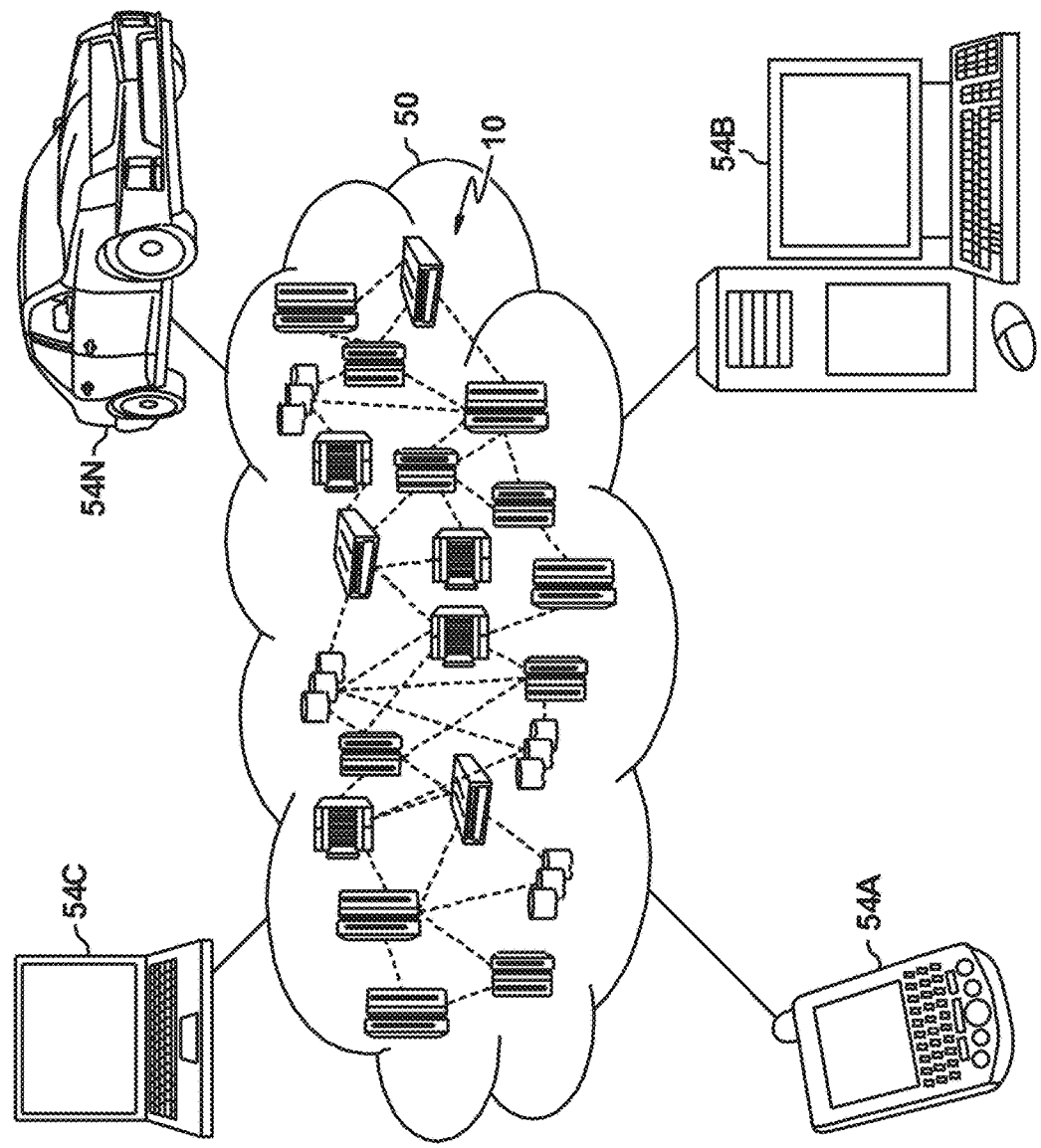
FIG. 1 depicts a cloud computing environment according to an embodiment of the present invention.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 1 are intended to be illustrative only and that computing nodes 10 and cloud computing environment 50 can communicate with any type of computerized device over any type of network and/or network addressable connection (e.g., using a web browser).

Figure 2:
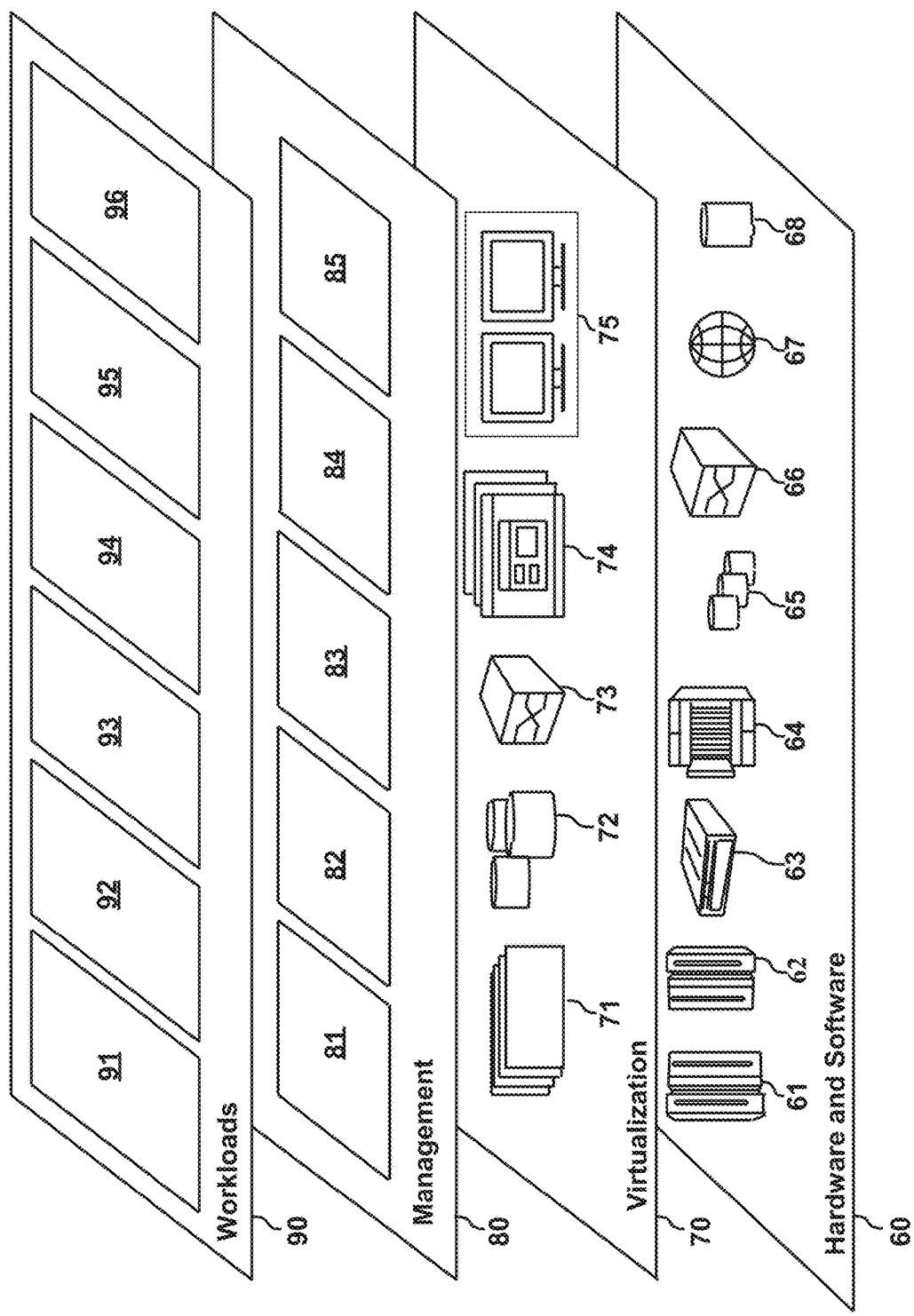
FIG. 2 depicts abstraction model layers according to an embodiment of the present invention.

Referring now to FIG. 2, a set of functional abstraction layers provided by cloud computing environment 50 (FIG. 1) is shown. It should be understood in advance that the components, layers, and functions shown in FIG. 2 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and a cloud-based service for capturing the global structure of logical formulae with graph long short-term memory 96.

As noted, theorem proving is the task of proving (or disproving) a conjecture C from a collection of axioms A (e.g. known facts) with a set of inference rules I. Theorem proving can be formulated as a search problem (there are typically many axioms, some of which should be used, and some of which are not needed). During the search, it is desired the find the best set of axioms for initial use. Current automated theorem provers typically struggle when given large collections of axioms due to the exploration of irrelevant regions of proof search-space that do not contribute to the final solution. In order to make theorem provers better when using large axiom sets, since not all axioms are needed for the proof of a given conjecture, not all branches in the proof search space are worth exploring.

Premise Selection refers to a binary classification task wherein it is determined which axioms are necessary for proving a given conjecture.

Proof Step Classification refers to a binary classification task wherein it is determined which intermediate proof steps are necessary for proving a given conjecture.

Figure 3:
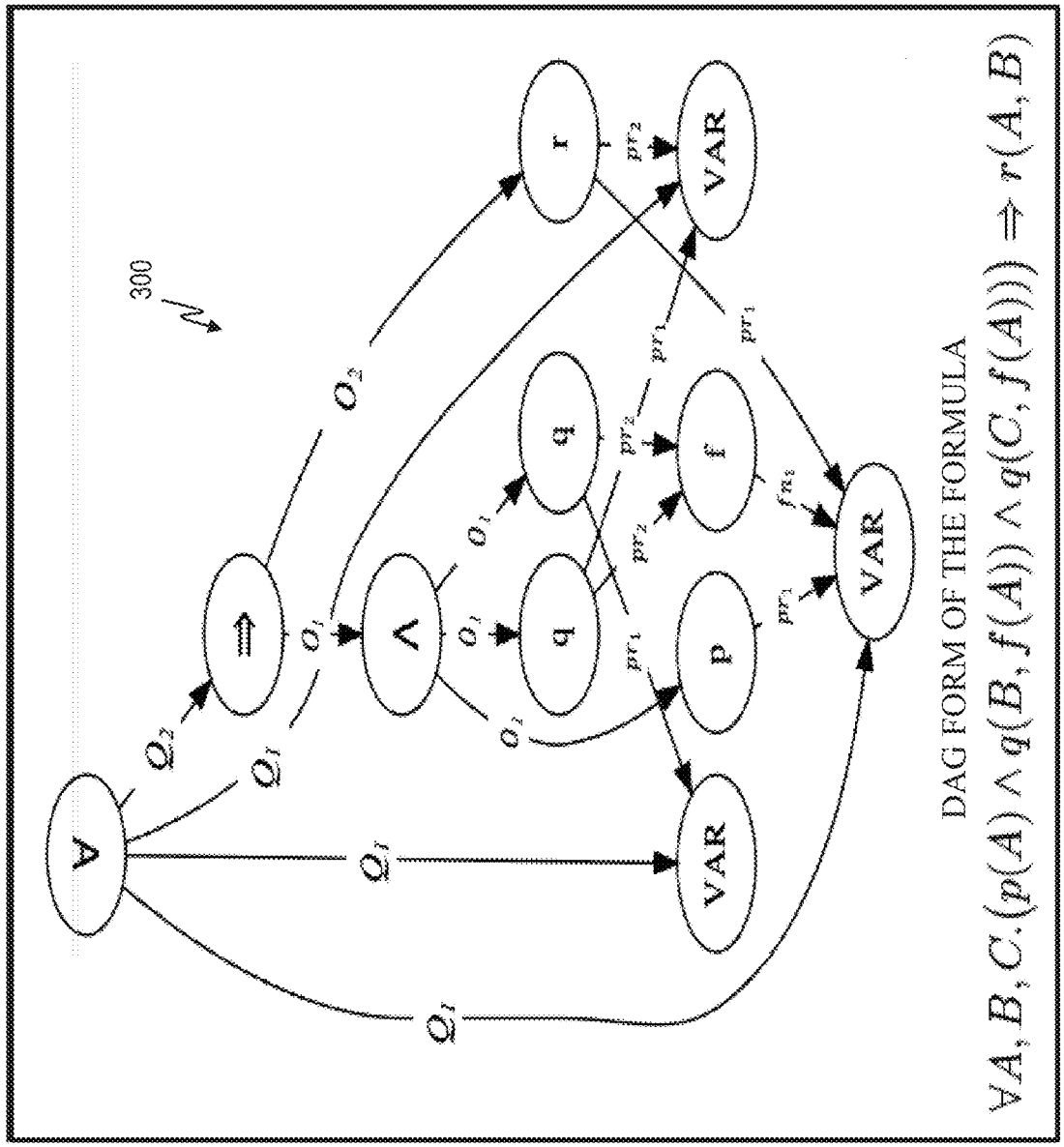
FIG. 3 shows a directed acyclic graph structure (DAG) representing a logic formula in accordance with an aspect of the invention.

A logical formula encodes some information about the world. For example, the first order logic formula $\exists X [cat(X)$ & $orange(X)]$ means "There exists a cat that is orange". Logical formulae are used in knowledge bases, software specifications, mathematical proofs, SAT (Boolean satisfiability problem) solving, etc. Logical formulae can have an underlying directed acyclic graph structure (DAG) that correspond to the formula parsing graph. FIG. 3 shows the DAG form 300 of the formula $\forall A, B, C (p(A) \wedge q(B, f(A)) \wedge q(C, f(A))) \Rightarrow r(A, B)$. This graph in FIG. 3 is created modifying the parsing graph of a formula, by the addition of some logical properties such as: commutativity of logical operators and symbols, variables renaming, etc.

To pass logical formulae of any kind (e.g. propositional/first-order/higher-order logic) as inputs to most machine learning systems, they should first be translated to a vector representation in an embedding space. Ideally, the translation discards as little information from the input as possible and reflects the similarity/dissimilarity between the graphs.

Prior-art symbol-based techniques treat a formula as a bag of its constituent symbols, embedding the formula with a "vanilla" (common or generic) feed-forward network/CNN over (max/sum/mean)-pooling of node embeddings. This disadvantageously loses all structural information. Prior-art tree-based techniques treat a formula as its abstract syntax tree, embedding the formula with a tree LSTM. This disadvantageously loses the notion of shared subexpressions and variable quantifications. Prior art graph-based techniques treat a formula as a DAG with shared subexpressions, embedding the formula with a Graph Neural Network (e.g. Message-Passing GNN) which represents each node as an embedding influenced by its immediate neighborhood only. Graph embedding is then max-pooling over individual node embeddings. This disadvantageously loses global structural information.

Figure 4A:
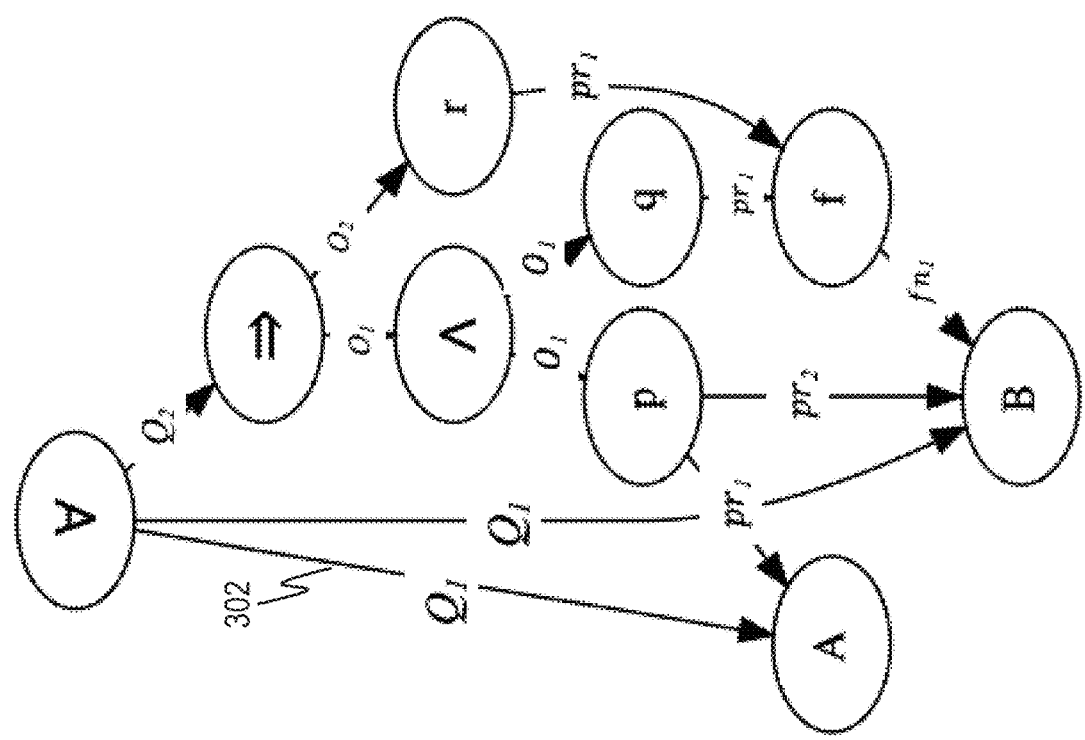
FIGS. 4A and 4B show dependency-layered updates in a graph LSTM, according to an aspect of the invention.
Figure 4B:
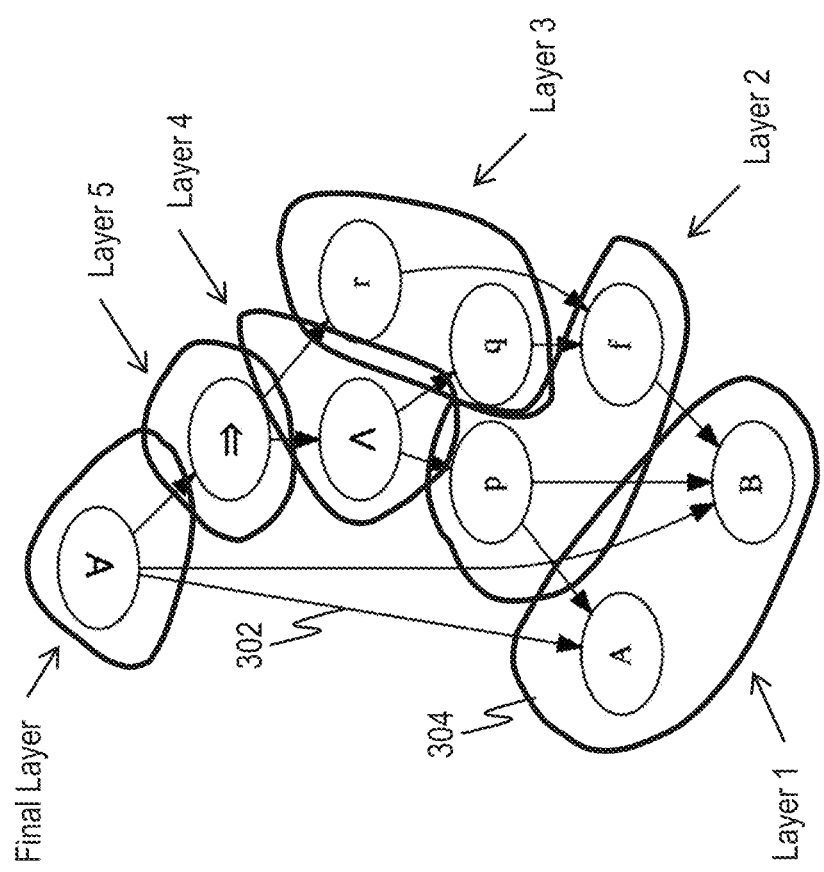

Referring to FIGS. 4A and 4B, in one or more embodiments, given a logical formula, a DAG is generated that reflects the formula structure, with directed edges (e.g. 302) from parents to children, and edge labels that reflect the rank of the child in the partial ordering of the arguments of its parent(s). Local neighborhoods (e.g. 304) of nodes are still useful, and one or more embodiments capture local neighborhoods of nodes with GNN. To generate an embedding for the entire graph, one or more embodiments pool the GNN embeddings according to a topological order of the graph (it always exists since we are considering DAGs) with graph LSTM.

With regard to the GNN aspect, in one or more embodiments, generate a graph $G=(V, E)$ from the input logical form. Assign each node v and edge e in G an initial embedding, $x_v$ and $x_e$. Initial node states are computed by passing embeddings through feed-forward networks $F_V$ and $F_E$, node states $s^0_v = F_V(x_v)$ and $h_e = F_E(x_e)$. The message-passing phase runs for $t=1, \ldots, T$ rounds, where each round includes the updates shown in the equations of FIG. 5.

With regard to the GLSTM aspect, in one or more embodiments, compute a topological order of the graph. Beginning from lowest rank of the topological sort, compute updates layer by layer (note exemplary layers Layer 1, . . . , Layer 5, Final Layer in FIG. 4B). Node embeddings in each layer are drawn from GNN, i.e. $s^T_v$. Final embedding for the graph is given by the embedding for the root node, i.e. $h_{root}$. Refer to the equations of FIG. 6.

Figure 7:
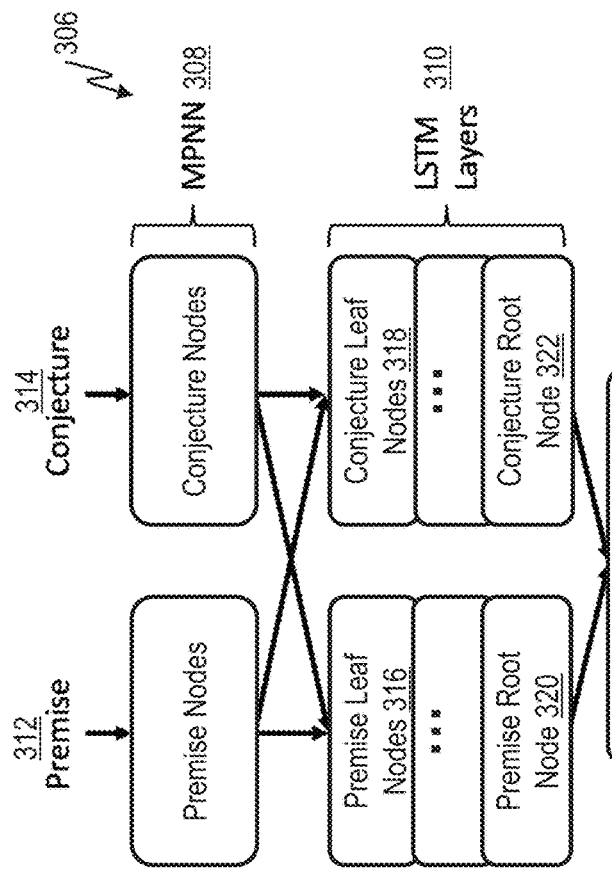
FIG. 7 presents an exemplary model architecture, according to an aspect of the invention.

Referring to FIG. 7 (discussed in greater detail below), consider now dependent embeddings. Existing methods embed the premise and conjecture formulas independently of one another. In one or more embodiments, the embedding process for both formulas decides what constituent elements are relevant for comparison; this improvement allows information about the relative changes of nodes in one graph as compared to the other to influence what is aggregated during the LSTM pooling stage. Each node embedding in both $S_P$ and $S_C$ is concatenated with the mean of embeddings for each identically labeled node from the opposite graph, as per the equations of FIG. 8.

As will be discussed further below, the table of FIG. 9 shows non-limiting experimental results for "MIZAR" premise-selection, achieved with an exemplary embodiment of the invention, wherein T indicates the number of MPNN message-passing rounds.

It is worth noting that unlike prior art tree LSTM encodings, one or more embodiments advantageously can capture shared subexpressions and variable quantifications. Furthermore, MPNN (message passing NN) by itself is known from the prior art, while MPNN-GLSTM and DEP-MPNN-GLSTM represent results achieved with exemplary embodiments of the invention.

One or more embodiments are useful, by way of example and not limitation, in domains such as software design and verification, where automatic theorem provers (ATPs) are used to prove that a system satisfies some formal design specification. One or more embodiments can be used directly in the decision making process of a theorem prover to help in narrowing its search space and hence extending traditional provers to handle the computational challenges inherent to reasoning at scale. The input is typically a specification which defines a domain (e.g. proper functioning of some piece of software or hardware (e.g. logic circuitry)); the specification can, for example, be in the form of a logical statement/axiom. The output is typically a proof of some property about the domain (software or hardware does or does not function properly). For example, suppose there is a piece of software code that is always supposed to return a positive value. The output could be a proof that the output will indeed always be greater than zero, or an indication that there is insufficient data to make the proof (perhaps due to an incomplete specification), or an indication that the proof failed and negative outputs are possible. Some embodiments are not limited to the software/logic circuitry domain, but can be generally used whenever a system can be formally described using logical statements.

One or more embodiments provide a system for learning efficient vector-space embeddings of logical formulae that leverages their underlying DAG structure to address the limitations of embedding methods based on tree LSTMs and vanilla GNNs. Further, one or more embodiments provide a novel graph neural network architecture which computes each node embedding as the aggregated information of all its immediate predecessors, with initial node embeddings being taken from the MPNN stage of the proposed system. Node updates are computed in the order given by a topological sort of the graph. These techniques can be applied, for example, for finding an embedding of the whole graph by aggregating the embeddings of the individual nodes and utilizing both the local and global structural information of each node.

Furthermore, one or more embodiments provide a novel architecture for constructing dependent embeddings, where both the premise and the conjecture graphs are co-learned, and/or a graph representation for logic formulas that preserves logical properties, such as name invariance, ordering between arguments, and preservation of commutative properties.

Even further, in one or more embodiments, a graph LSTM, or any architecture that can handle sequential graph data, can be used for pooling the GNN node embeddings according to the topological order of the graph. One or more embodiments can be incorporated directly into the decision making process of a theorem prover to test its effectiveness for proof guidance.

While state of the art theorem provers excel at finding complex proofs in restricted domains (e.g. TPTP) they have historically had difficulty when reasoning in broad contexts. With the generation of several large logical theories (collections of axioms) for reasoning there has been an interest in extending traditional theorem provers to handle the computational challenges inherent to reasoning at scale.

A natural way to address this challenge has been to design sophisticated mechanisms that allow theorem provers to determine which axioms or intermediate proof outputs merit exploration in the proof-search process. These mechanisms thus prune an otherwise unmanageably large proof search space down to a size that can be handled efficiently by classical theorem provers. The task of classifying axioms as being relevant to a given conjecture is referred to as premise selection, while the task of classifying intermediate proof-steps for being a part of the final proof to a given conjecture is referred to as proof step classification.

Traditional approaches for solving these two tasks are based on manually designed heuristics which perform symbolic analysis of the formulas. Recently, several machine-learning based techniques have been shown to outperform or provide a competitive performance compared to traditional heuristics-based methods. There is a rising interest in adapting neural approaches to the aforementioned tasks, however, the highly structural nature of logical formulae has made such adaptations challenging.

As such, structure-aware methods have found the most success; the two most effective architectures have been tree LSTMs and message-passing graph neural networks (GNNs). However, both tree LSTMs and vanilla GNNs suffer from their inability to represent global structure. Tree LSTMs over the abstract syntax trees of logical formulae end up with a global representation of the tree, but the notion of shared subexpressions and variable quantifications are lost. Traditional GNNs capture the shared subexpressions and variable quantifications, but local neighborhoods of nodes are combined together with a simple pooling operation to form the vector space representation of the graph: the global graph embedding for a formula is a simple pooling operation over node embeddings representative of only their local neighborhoods.

To address these two limitations, one or more embodiments build on both GNNs and tree LSTMs to represent the complex structure of logical formulae. In particular, one or more embodiments introduce a hybrid method that produces high-quality node embeddings with a message-passing graph neural network, and then pools them together in a way that is structure-dependent with graph LSTMs. This overcomes the inability of vanilla GNNs to embed more than just the local neighborhoods of nodes by using an LSTM-based method that computes the embedding of each node to be functions of its dependencies in the DAG form of the given formula. It also allows tree LSTMs to capture the complete graph-structure by reifying duplicate sub-expressions and variables, thus keeping the relevant contextual information surrounding each node (e.g. a variable with all the terms it appears in) in close proximity to that node (rather than in distinct regions of a tree representation).

Herein, the performance of exemplary inventive models on premise selection is evaluated with the "MIZAR" dataset and on proof step classification with the "HolStep" dataset, where experiments we have conducted show that a hybrid architecture in accordance with aspects of the invention outperforms all other approaches on both datasets.

Referring to FIG. 7, an exemplary architecture 306, in accordance with aspects of the invention, combines two types of graph neural networks, first computing a set of initial node embeddings with a message-passing neural network (MPNN) 308, then passing those node embeddings into a graph LSTM 310, which can be viewed as a sophisticated pooling mechanism. The final graph embedding is given by the hidden state of the highest rank node of the graph, i.e. the root of the input formula.

One or more embodiments advantageously provide a system for learning efficient vector-space embeddings of logical formulae that leverages their underlying DAG structure to address the limitations of embedding methods based on tree LSTMs and vanilla GNNs. In particular, one or more embodiments introduce a hybrid method that produces high-quality node embeddings with a message-passing graph neural network 308, and then pools them together in a way that is structure-dependent with graph LSTMs 310. This overcomes the inability of vanilla GNNs to embed more than just the local neighborhoods of nodes by using an LSTM-based method that computes the embedding of each node to be functions of its dependencies in the DAG form of the given formula. It also overcomes the limitations of tree LSTMs by capturing the global graph-structure through the reification of duplicate sub-expressions and variables, thus keeping the relevant contextual information surrounding each node (e.g. a variable with all the terms it appears in) in close proximity to that node (rather than in distinct regions of a tree representation).

One or more embodiments further provide a novel graph LSTMs architecture which computes each node embedding as the aggregated information of all its immediate predecessors, with initial node embeddings (i.e. each $s_v^t$ which indicates the state of graph node v (i.e. its embedding) at the t-th round of update) being taken from the MPNN stage of the proposed system. Node updates are computed in the order given by a topological sort of the graph.

Even further, one or more embodiments provide a novel architecture for constructing dependent embeddings where both the premise 312 and the conjecture 314 graphs are co-learned; and/or a graph representation for logic formulas that preserves logical properties, like name invariance, correspondence of sub formulas with sub-graphs, ordering between arguments, and preservation of commutative properties.

One or more embodiments can be incorporated directly into the decision making process of a theorem prover to test its effectiveness for proof guidance; to help in narrowing its search space and hence extending traditional provers to handle the computational challenges inherent to reasoning at scale.

It is worth noting at this point that, generally, a neural network includes one or more computer processors that are configured to work together to implement one or more machine learning algorithms. The implementation may be synchronous or asynchronous. In a neural network, the processors simulate thousands or millions of neurons, which are connected by axons and synapses. Each connection is enforcing, inhibitory, or neutral in its effect on the activation state of connected neural units. Each individual neural unit has a summation function which combines the values of all its inputs together. In some implementations, there is a threshold function or limiting function on at least some connections and/or on at least some neural units, such that the signal must surpass the limit before propagating to other neurons. A neural network can implement supervised, unsupervised, or semi-supervised machine learning. In supervised or semi-supervised machine learning the neural network is provided with a set of sample input data and sample output data, and adjusts the connections between the simulated neurons until it can produce the sample output data from the sample input data. Then the neural network is provided with a new set of input data to produce a new set of output data. In unsupervised machine learning, the neural network is provided only with input data, and outputs a categorization of the input data in response to patterns that it identifies in the input data.

Recent advances in the integration of deep learning with automated theorem proving have centered around the representation of logical formulae as inputs to deep-learning systems. In particular, there has been a shift from character and token-level representations to graph-structured representations, in large part driven by the rapidly emerging body of research on geometric deep learning. Thus far, the neural architectures proposed for capturing the inherent structural information of logical formulae have been fundamentally limited in that they can represent only local structure. One or more embodiments provide a novel method for the embedding of logical formulae into vector space with graph LSTMs, which is designed to capture the complete global structure of the inputs. One or more embodiments advantageously provide an inventive framework which generalizes and improves previous approaches that utilize tree LSTMs and message-passing GNNs. Experimental results demonstrate its effectiveness on the tasks of premise selection classification on two standard datasets.

Formulae in first-order logic are constructed from a collection of logical connectives, quantifiers, predicates, functions, and constants. A term can be a quantified variable, constant, or a function applied to some number of terms. A formula is either a predicate applied to some number of terms, a connective applied to some number of formulas, the negation of a formula, or a quantifier introducing a variable into a formula. A higher-order logic formula is built from constants, functions, and quantifiers, where quantification is now allowed to range over functions. For higher-order logic, first-order logic constructs such as predicates and connectives have simply been categorized as functions.

In one or more embodiments, a graph is represented as a pair G=(V, E), where V={$v_1, \ldots, v_n$} is the set of all vertices in G and E is the set of all edges in G where each edge is a tuple including two vertices from V, i.e. $e_{ij}=(v_i, v_j)$. The graphs of interest herein include directed-acyclic graphs, meaning that each edge $e_{ij} \in E$ is an ordered tuple, and there is no way of starting from any vertex v in V and traversing through edges in E such that one returns to the original vertex v.

One pertinent question to arise when applying deep-learning to automated reasoning is that of representation. While the earliest work on integrating deep-learning with reasoning techniques used symbol-level representations of input formulae, subsequent work explored using the abstract syntax trees or DAG forms as the representation for input formulae. On the HolStep and HoList datasets, the DAG forms of logical formulae were found to be the more effective as compared to bag-of-symbols and tree-structured encodings.

One or more embodiments focus on DAG representations of formulae, an example of which can be found in FIG. 3. The conversion of a formula into a DAG is as expected, i.e., directed edges are added from parents to their arguments and shared sub-expressions are mapped to the same sub-graphs. One or more embodiments extend this standard transformation in two directions as follows. The name of each variable is replaced by a generic variable token, which simplifies the encoding and is possible since variable names have no innate meaning, given that the DAG representation maintains the relevant connections. Collapse binarized formulae with a leading connective into flatter forms when doing so would not influence semantic meaning. For instance, one or more embodiments utilize the associativity and commutativity of $\wedge$ and transform a formula $(a \wedge (b \wedge (c \wedge d)))$ into the equivalent form $\wedge(a, b, c, d)$, which lets the local neighborhoods of nodes capture more information. In the first case, a is two connections removed from c and d, while in the second, a is one connection removed from c and d.

Capturing the ordering of arguments in logical expressions is still an open topic of research; some researchers have used a treelet encoding scheme that represents the position of a node relative to other arguments of the same parent as triples; others have used positional edge-labels, assigning each edge a label which reflects the position of its outgoing node in the argument list of the node's parent. One or more embodiments modify this latter approach, such that the arguments to a particular node are given by a partial ordering. That is, for logical connectives like conjunctions ($\wedge$), biconditionals ($\Leftrightarrow$), predicates like equality (=), and the like, all arguments are of the same rank. For other predicates, functions, and logical connectives with an order like implications ($\Rightarrow$), the arguments are linearly ordered. However, one or more embodiments also support hybrid cases like simultaneous quantification over multiple variables. For instance, consider the formula $\forall A, B, C \cdot p(A, B, C))$. Each variable is the same rank (i.e. the variables could be reordered and the semantics would not change), but all variables must come before the subexpression p(A, B, C). Thus, each of A, B, and C would have rank 1 and p would have rank 2.

The label given to each argument edge in the graph is the rank of the corresponding argument to source parent node concatenated with the type of the parent node (pred, func, const, var for all predicates, functions, constants, and variables or the label of the connective or quantifier). In a non-limiting example, the edge label between the $\forall$ node and both A and B is $\forall\_1$, but between the $\forall$ node and p is $\forall\_2$. One or more embodiments also add a parent edge in the reverse direction (i.e. from argument to parent) with a parent label. This is done to allow the message-passing phase of one or more embodiments to accumulate relevant information about the many contexts in which each argument appears (i.e. a variable may appear as the argument to several terms).

One or more embodiments advantageously modify the DAG conventions such that binarized formulae with commutative and associative leading connectives are collapsed into more compact, flattened forms, and/or the edges of graphs are labeled with the rank of their attached argument node with respect to the partial ordering defined over the arguments of their attached parent(s).

An exemplary architecture 306, in accordance with one or more embodiments, combines two types of graph neural networks, first computing a set of initial node embeddings with a message-passing neural network (MPNN) 308, then passing those node embeddings into a graph LSTM 310, which can be viewed as a sophisticated pooling mechanism. The graph LSTM will accumulate information (beginning from the leaf nodes; note premise leaf nodes 316 and conjecture leaf nodes 318) upwards through the graph until the root node (note premise root node 320 and conjecture root node 322) is reached, at which point it will terminate and return the final graph embedding which is simply given by the hidden state of the root of the input formula.

The MPNN framework can be thought of as an iterative update procedure that represents a node as an aggregation of information from its local neighborhood. One or more embodiments leverage an MPNN to construct a set of initial node embeddings, which will then be passed to a graph LSTM for pooling. To begin, one or more embodiments assign each node and edge of a graph G=(V, E) an initial embedding, $x_v$ and $x_e$. An initial node state is then computed by passing each such embedding through feed-forward networks $F_V$ and $F_E$, producing node states $s_v^0 = F_V(x_v)$ and $h_e = F_E(x_e)$. Lastly, a message-passing phase runs for t=1, ..., T rounds, where each round includes the updates shown in FIG. 5.

$F_M^t$ and $F_A^t$ are feed-forward neural networks unique to the t-th round of updates and [$x_i$; $x_j$] denotes concatenation, e.g. the concatenation of vectors $x_i$ and $x_j$. In one or more embodiments, my are considered as the messages to be passed to $s_v$, and $s_v^t$ represents the node embedding for node v after t rounds of iteration. Each of the node embeddings will be passed to the subsequent pooling layer described below.

Graph LSTMs can be viewed as the extension of tree-LSTMs to graph structured data. Graph LSTMs compute each node's embedding as the aggregated information of all its immediate predecessors. With initial node embeddings (i.e. each $s_v^t$) being taken from the MPNN stage 308, node status (given by $h_v$) can be computed by the equations in FIG. 6.

The encircled dot denotes element-wise multiplication, P is a function that takes a node v as an argument and returns the immediate children of v in G, and each of $U_i$, $U_o$, and $U_c$ are matrices. The parameters i and o represent input and output gates, while c and ĉ are intermediate computations, and f is a forget gate that modulates the flow of information from individual children into the node's computed state. Each edge embedding $h_{evw}$ is generated as in the MPNN, but with a separate feed-forward network $F'_E$. Given the teachings herein, the terms in the equations will be understandable to the person of ordinary skill in the field, who will be familiar with LSTMs.

It is worth noting that in prior work, there would typically be matrices for each edge type (i.e. rather than just $U_i$ there would be $U_i^k$ for each edge type k). One or more embodiments employ the simpler representation presented above to reduce the number of parameters in the model.

It is also worth noting that in one or more embodiments, node updates are computed in the order given by a topological sort of the graph (otherwise, one would risk computing a parent embedding before computing the embeddings of its children). Batching can be done at the level of topological equivalence, i.e. every node that is of the same rank can have its updates computed simultaneously. Across batches of graphs, it is even possible to do load-balancing to ensure that the number of nodes updated at each layer is roughly equivalent (since there are no dependencies between the nodes of graphs in different training examples).

Heretofore, neural approaches to both premise selection and proof guidance have typically opted to embed the premise and goal formulas independently of one another. They embed the graph of the premise and then separately embed the graph of the goal, and then train a classifier (typically a deep feed-forward network) that determines whether the vector representations of both the premise and goal are similar enough to warrant exploration (for proof guidance) or entailment (for premise selection). This is somewhat of a limitation, as the embedding process for both formulas must decide what constituent elements are relevant for comparison without knowledge as to what they will even be compared against. One or more embodiments address this issue using the technique outlined below.

Let $S_P$ and $S_C$ be the set of node embeddings computed from the initial MPNN of the approach for the premise and conjecture graphs 312, 314. Each node embedding in both $S_P$ and $S_C$ is concatenated with the sum of embeddings for each identically labeled node from the opposite graph, i.e., as in FIG. 8.

Then, where the graph LSTM would before use $s_u$, it is replaced with the resultant combination (i.e. $[s_u; \Sigma_v s_v]$). This change allows information about the relative changes of nodes in one graph as compared to the other to influence what is aggregated during the LSTM pooling stage, as indicated by the arrows crossing from 312 to 314 and vice-versa. The use of the sum operator rather than a max-pooling or mean-pooling operation is done to capture the total magnitude of changes (for instance, capturing whether or not a node was seen in different amounts between the premise and conjecture). Note that, because each node embedding is computed by the MPNN component 308, it is not necessarily the case that $s_u = s_v$ when the number of message-passing updates is greater than zero (as each node embedding accumulates information from its neighbors).

Also, because variables have been anonymized at this point, they are not included in this cross graph information process (doing so was found to add too much noise to the process); instead, simply concatenate them with a zero vector. FIG. 7 provides a graphical depiction of the model architecture 306, where the cross graph information flow can be seen between the MPNNs 308 and the inputs of the LSTMs 310.

For all experiments using only the MPNN component of architecture 306, the inputs to the classifier network include a max-pooling of the individual node embeddings for each graph, i.e. $s_P = POOL(S_P)$ and $s_C = POOL(S_C)$. When the LSTM was used, the final graph embeddings for the premise and conjecture were taken to be the hidden states for the root nodes of the premise and conjecture, $s_P = h_{root}^P$ and $s_C = h_{root}^C$. In either case, once computed, the resultant graph embeddings are concatenated and passed to a classifier feed-forward network $F_{CL}$ 324 for the final prediction 326, i.e. $F_{CL}([s_P; s_C])$.

Experiments were conducted to evaluate an exemplary embodiment on the tasks of premise selection and proof step classification with two different datasets: HolStep and MIZAR; the skilled artisan in the field of automatic theorem provers will be familiar with both. Both tasks are treated as a binary classification problem, where an exemplary approach is given a premise/proof-step and conjecture and classifies the premise/proof-step as either relevant or irrelevant to the conjecture.

In the exemplary model, all initial node embeddings were 128-dimensional vectors and all initial edge embeddings were 32-dimensional vectors. The initial feed-forward networks $F_V$, $F_E$, and $F'_E$ expanded the embeddings to double their initial size and used a single hidden layer with dimensionality equal to the output size, i.e. 256/64. All other feed-forward networks (each $F_M^t$, each $F_A^t$, $F_{CL}$) followed mostly the same configuration, except for their input dimensionalities. Each included two hidden layers with dimensionality equal to the output layer. In one or more embodiments, every hidden layer for all feed-forward networks is followed by batch normalization and then a ReLU activation. The final activation for the classifier network $F_{CL}$ was a sigmoid activation and for all other feed-forward networks the final activations were ReLUs. In the LSTM, the hidden states were 320 dimensional vectors. For the vanilla graph LSTM without cross-graph information, each of $W_i$, $W_o$, $W_f$, and $W_c$ were learned 256×320 matrices. For the graph LSTM with cross-graph information, each of $W_i$, $W_o$, $W_f$, and $W_c$ were learned 512×320 matrices. In both LSTM versions, the hidden states are of the same dimensionality, and thus each of $U_i$, $U_o$, $U_c$, and $U_f$ were learned 320×320 matrices.

The exemplary models were constructed in PyTorch and trained with the Adam Optimizer with default settings. The loss function that was optimized for was binary cross-entropy. Each model was trained for a maximum of five epochs on both HolStep and MIZAR, as experiments over validation data found no gain from further training. Performance on the validation sets was evaluated after each epoch and the final model used for evaluation on the test data was taken from the best performing epoch.

MIZAR is a corpus of 57,917 theorems, of which 32,524 theorems have an associated ATP proof. One or more embodiments use only the 32,524 theorems with an ATP proof, as those have been paired with both positive and negative premises (i.e. premises that do/do not entail a particular theorem) that can be used to train one or more embodiments. One or more embodiments randomly split the 32,524 theorems 90%/10%/10% for training, development, and testing sets (i.e. sizes of 26,020/3,252/3,252). From the theorem files 522,520 examples were extracted (i.e. 417,763/51,877/52,880 for train/development/test). An example included a premise, a conjecture, and a label for whether that premise was known to directly contribute to proving the conjecture.

Figure 10:
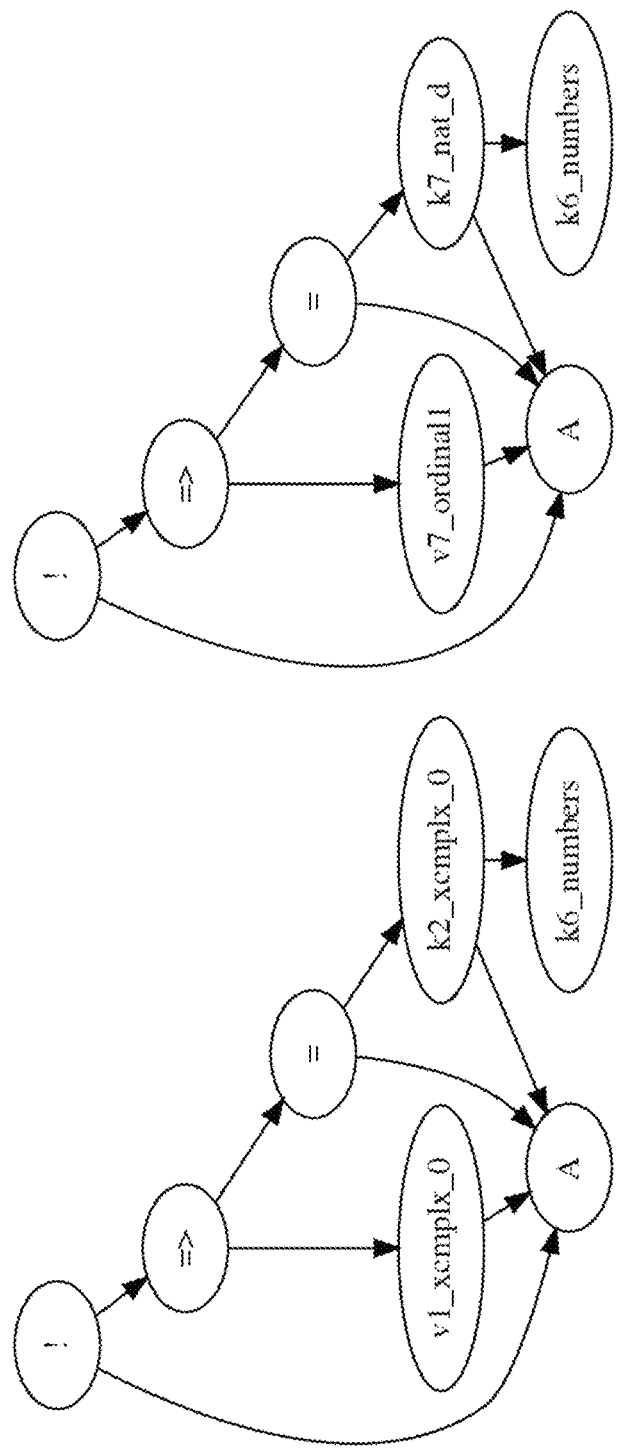
FIG. 10 shows the DAG representation of a premise (left) entailing a hypothesis (right) in accordance with an aspect of the invention.

The MIZAR dataset was chosen because of the method by which it was constructed. While the positive examples are simply those premises that were needed for the proof of their associated conjecture, the negative examples (i.e. premise-conjecture pairs where the premise was not needed to prove the conjecture) are formulas that were highly ranked by a k-NN premise-selection approach trained on the complete dataset. This makes the premise selection problem much more difficult, as approaches relying on local structural differences or bag-of-words similarity have much less to work with. Consider FIGS. 10 and 11. In both cases, the premise and conjecture formulas are practically identical, with the only differences being the result of two label exchanges. FIG. 10 depicts two graphs (one for the premise, P, and one for the conjecture, C) that differ only in that the two nodes in the middle have a different label, and it is an example where P entails C. In FIG. 11 the graphs differ in a similar manner, but a little bit more, and here P does not entail C. This illustrates the above-mentioned aspect of the difficulty of the premise selection problem.

HolStep is a large corpus designed to test machine learning approaches to automated reasoning. While the corpus provides training and evaluation data for a number of tasks in the automated reasoning domain, one or more embodiments focus on the portion needed for proof step classification. The proof step classification section includes 9,999 conjectures for training and 1,411 conjectures for testing, where each conjecture is paired with an equal number of positive and negative proof steps (i.e. proof steps that were/were not part of the final proof for the associated conjecture). From those 11,400 conjectures, 2,013,046 training examples and 196,030 testing examples are extracted. Each example is of the same form as in MIZAR, i.e. a triple with the proof-step, conjecture, and a label indicating whether the proof-step was part of the final proof-tree that derived the conjecture. Positive examples were thus taken from the proof-tree of a given conjecture, while negative examples were selected from the proof-steps taken during the proof process that ultimately did not lead to a successful proof. Ten percent of the training examples were partitioned off to be used as a development set.

In the tables of FIGS. 9 and 13, MPNN represents the performance of using only the message passing component 308 of architecture 306 while MPNN-GLSTM architecture denotes the architecture that does not incorporate the premise MPNN output with the conjecture Graph LSTM pooling (and vice versa). Finally, Dep-MPNN-GLSTM denotes the architecture that incorporates the cross-graph information (i.e. the full functionality of architecture 306 shown in FIG. 7). The field T indicates the number of rounds of updates for each node.

MIZAR Dataset: The table of FIG. 9 shows the performance of an exemplary embodiment, the basic MPNN architecture, and FormulaNet on the task of premise-selection. The code used to train and test FormulaNet on MIZAR was taken from the associated "github" repository, as will be familiar to the skilled artisan.

The Dep-MPNN-GLSTM architecture provides substantially better performance over both the MPNN-GLSTM and MPNN architectures, with a 2.4% gain over the best alternative. It is believed that the wide gap is attributable to the adversarial strategy by which the dataset was constructed. Unlike with HolStep, the negative examples involve real premises for other conjectures; thus, it is less likely that there will be constituent elements to the premise or conjecture that could be observed in isolation that would make the classification of entailment easy. This makes strategies that embed the premise and conjecture independently less effective, as further evidenced by the results set forth herein.

Figure 12:
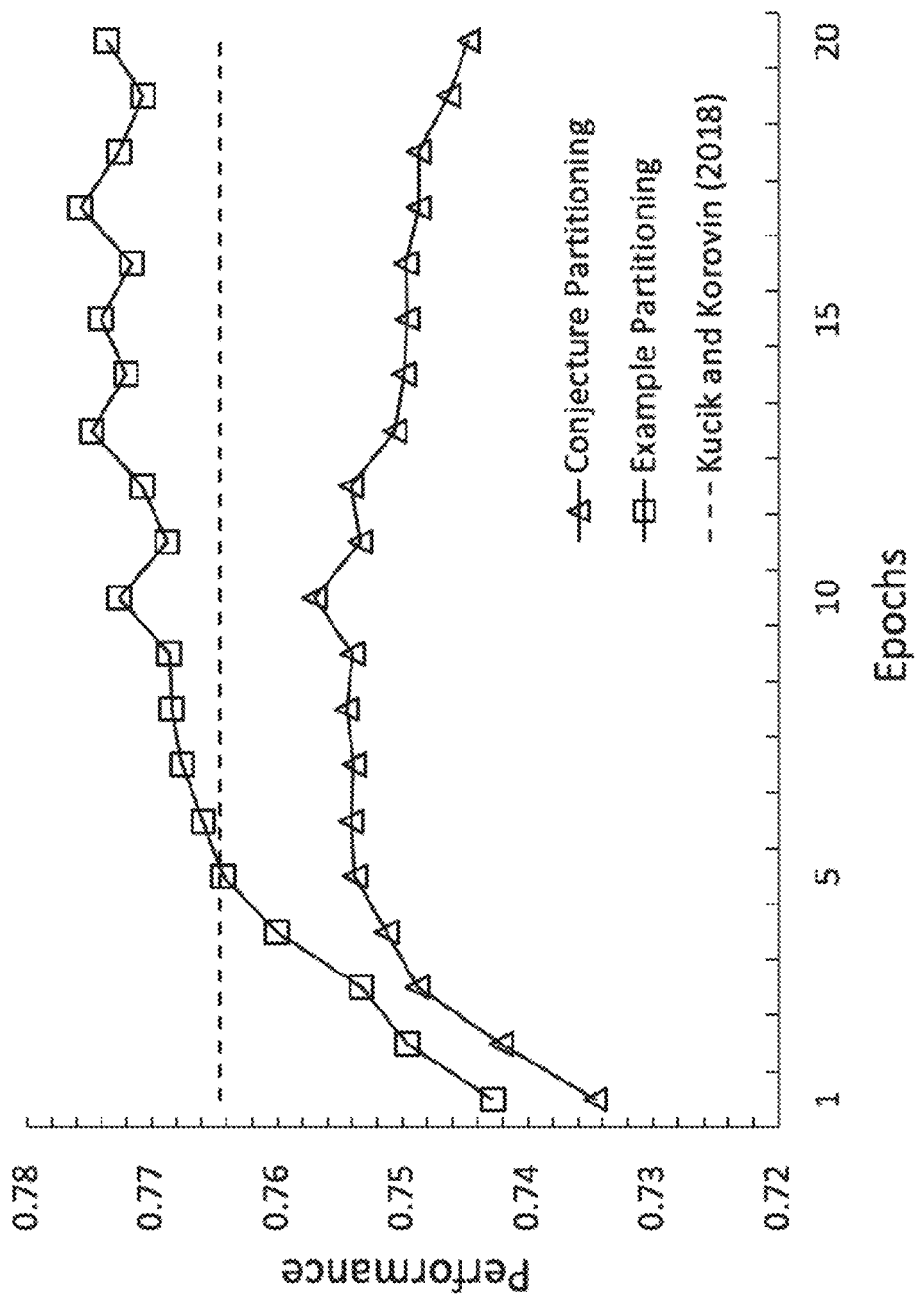
FIG. 12 is a graph showing non-limiting experimental results achieved with an exemplary embodiment of the invention.

To give a better idea as to why the distinction between splitting on the theorems versus splitting on the examples matters, refer to FIG. 12. Both curves show how performance of the Dep-GLSTM approach (with T=0 message-passing rounds) on the development set (y-axis) changes over the number of epochs (x-axis), but one line (triangles) shows performance when the development set is partitioned on conjectures and not examples and the other (squares) shows performance when the development set is partitioned on examples and not conjectures. The dotted line shows the performance achieved by Kucik, A. S., and Korovin, K., 2018, Premise selection with neural networks and distributed representation of features, arXiv preprint arXiv:1807.10268. As might be anticipated, when test conjectures are mixed in to the training data, over-fitting becomes practically a non-issue and the problem becomes substantially easier.

HolStep Dataset: The table of FIG. 13 shows the performance of an exemplary embodiment, the basic MPNN architecture, and the CNN-LSTM, CNN, Deepwalk, and FormulaNet approaches on the task of proof step classification. Regarding the former two, refer to Kaliszyk, C., et al., 2017, Holstep: A machine learning dataset for higher-order logic theorem proving, arXiv preprint arXiv:1703.00426; regarding the latter two, refer to Wang, M., et al., 2017, Premise selection for theorem proving by deep graph embedding. in *Advances in Neural Information Processing Systems,* 2786-2796. Unlike with MIZAR, the MPNN-GLSTM architecture was just as effective as the Dep-MPNN-GLSTM architecture. It is believed that this is due to the independent nature of proof steps and conjectures in the dataset. Both the Wang et al. and Kaliszyk et al references found that their architectures functioned just as well when performing classification on only the premise, rather than both the premise and conjecture (90.0% versus 90.3% for FormulaNet and 83.0% versus 83.0% for CNN-LSTM). In the unconditional setting (classification on only the premise), the Wang et al. reference pointed out that the upper bound on performance is 97%.

It will thus be appreciated that one or more embodiments provide techniques for computing vector-space embeddings of logical formulae that leverages their underlying DAG structure to address the limitations of embedding methods based on tree LSTMs and vanilla GNNs.

One or more embodiments represent the logical formulae as graphs where nodes represent variables, predicates, and functions while the edges connect them as dictated in the logic formula. Software design and verification is one non-limiting exemplary application of one or more embodiments. One or more embodiments find an appropriate, and in some circumstances, optimal or best, representation for logical formulas that captures all the semantics, locally and globally. One or more embodiments represent the logical formulae as graphs prior to embedding them efficiently into feature vectors that can be consumed by different machine learning applications, focusing on finding the best embeddings of logical formulas (rather than visualizing and manipulating them).

Unlike certain prior-art approaches wherein the nodes in the graphs are terms, in one or more embodiments, the terms are represented by a subgraph and not just a single node. Moreover, in some prior art techniques, the edges represent the logical operations and quantifiers, while in one or more embodiments, the logic operations are represented by nodes. One or more embodiments use a modified parsing graph. One or more embodiments employ neural networks-based learning; for example, a combination of different neural networks. One or more embodiments are based solely on learning (i.e., instead of a well-defined logical transformation) with the overall goal of an embedding of input formulae to decide a formula's relevance for proving (i.e., instead of a decision if a program satisfies a given formula condition). Also, unlike some prior-art approaches wherein the structure of the program-formulae will be restricted by the program language, one or more embodiments can deal with arbitrary first-order logic formulae and very diverse problems from large mathematical libraries.

One or more embodiments address learning an efficient representation of logical formulae, which can then be utilized by automated theorem provers to provide better proof guidance tactics. One or more embodiments encode semantic knowledge (e.g., by normalization of expressions, sharing of subexpressions) which is not present in simpler representations. One or more embodiments apply deep learning.

Given the discussion thus far, it will be appreciated that, in general terms, an exemplary method is provided for improving performance of a machine learning system carrying out automatic theorem proving by narrowing a search space. The machine learning system is implemented on at least one hardware processor (e.g. unit 16 in FIG. 14 discussed below). The exemplary method includes the step of generating, from a logical formula, a directed acyclic graph (see graph 300 for example) having a plurality of nodes and a plurality of edges. The logical formula(s) typically include(s) a premise formula and a conjecture formula (in some instances, parts of the system process the formulas sequentially, so at some time points only a single one is being considered). A further step includes assigning an initial embedding to each of the nodes and each of the edges. The initial embeddings assign each of the nodes to one of a plurality of layers (see the layers in FIG. 4B, for example) and include conjecture node embeddings and premise node embeddings (note the premise nodes and conjecture nodes in FIG. 7). Still a further step includes computing a plurality of initial node states for the nodes by using feed-forward networks (see discussion of feed-forward networks $F_V$ and $F_E$, above).

In one or more embodiments, cross-dependent embeddings are constructed between the conjecture node embeddings and the premise node embeddings.

An additional step includes topologically sorting the directed acyclic graph with the initial embeddings and the initial node states. A further step includes, beginning from a lowest rank obtained in the topologically sorting step, computing layer-by-layer embedding updates for each of the plurality of layers until a root one of the nodes is reached. For example, in FIG. 4B, see the layers one through five and the final layer with the root node ∀. An even further step includes assigning the embedding update for the root node as a final embedding for the directed acyclic graph.

Even further steps include providing the final embedding for the directed acyclic graph as input to the machine learning system (e.g. automatic theorem prover 328); and carrying out the automatic theorem proving with the machine learning system based on the input. One or more suitable software routines can be used, for example, to provide post-processing from the LSTM and/or pre-processing for the classifier, such as assigning the embedding update for the root node as a final embedding for the directed acyclic graph and/or providing the final embedding for the directed acyclic graph as input to the machine learning system.

In some cases, said steps of generating the directed acyclic graph, assigning the initial embedding, and computing the plurality of initial node states are carried out with a message passing neural network 308 implemented on the at least one hardware processor 16.

In some cases, the steps of topologically sorting the directed acyclic graph and computing the layer-by-layer embedding updates are carried out with a graph long short-term memory neural network 310 implemented on the at least one hardware processor.

Figure 8:
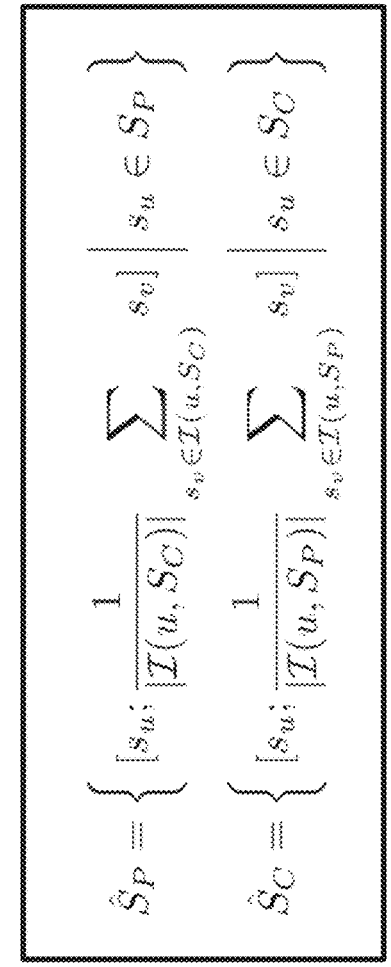
FIG. 8 presents equations for concatenating node embeddings in an exemplary method, according to an aspect of the invention.

The cross-dependent embeddings can be constructed, for example, by concatenation (using, e.g., computer code implementing equations of FIG. 8). For example, to construct a cross-dependent embedding for a premise node, take the average of all embeddings of conjecture nodes that are similar (those in the set $I(u, S_C)$) and append/concatenate it to the former node embedding. Similarly, for a conjecture node, take the average of all embeddings of premise nodes that are similar (those in the set $I(u, S_P)$) and append/concatenate it to the former node embedding.

In some cases, in the computing of the layer-by-layer embedding updates, nodes of the same rank have their updates computed simultaneously.

In one or more non-limiting exemplary embodiments, the logical formula includes a software specification. Some such embodiments further include releasing corresponding software for use when the automatic theorem proving indicates proper software functioning. The released software can then be used by one or more end users. Other such embodiments further include rewriting corresponding software when the automatic theorem proving indicates improper software functioning. The rewritten software can then be rewritten and tested again and released for use (and used) once it is acceptable.

Figure 15:
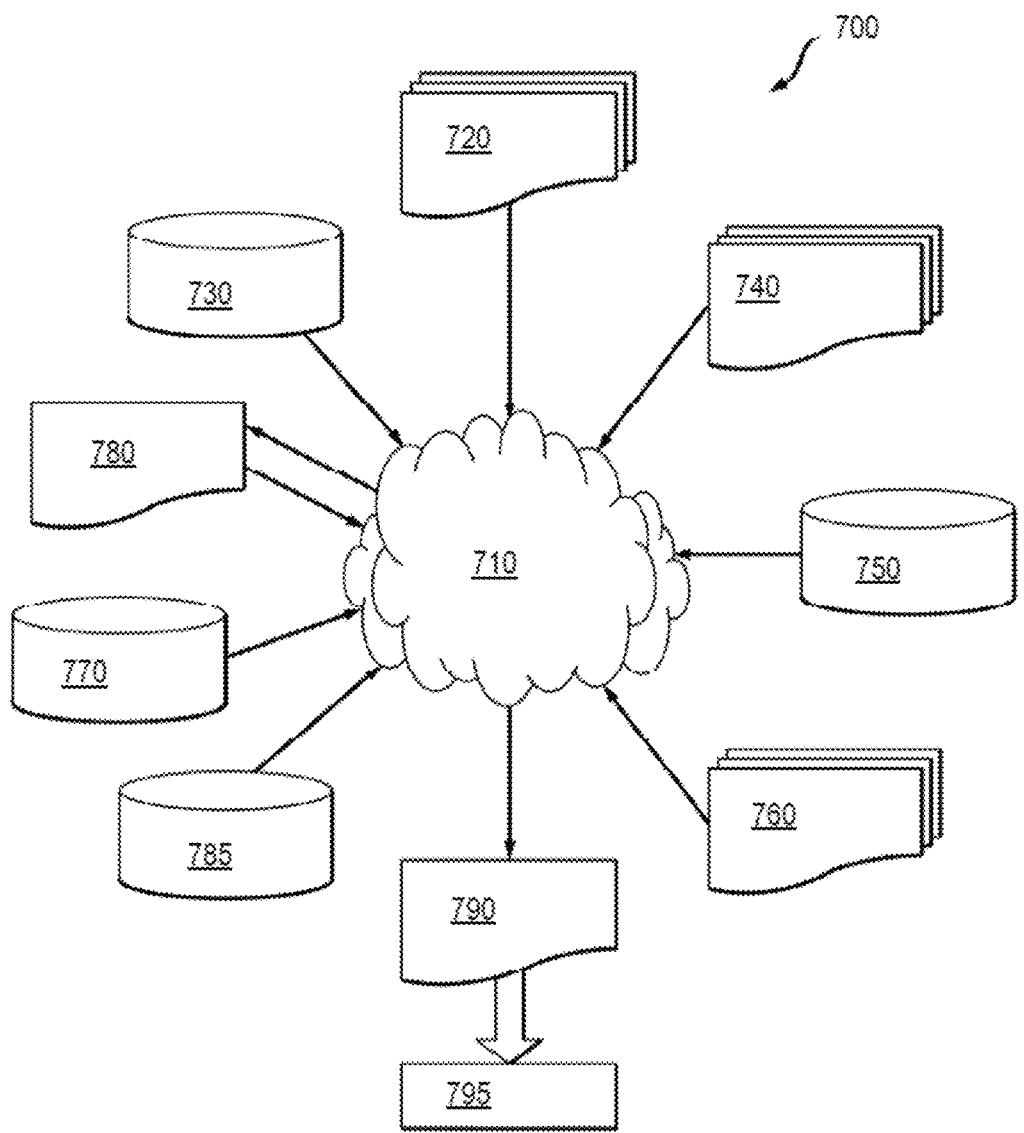
FIG. 15 is a flow diagram of a design process used in semiconductor design, manufacture, and/or test.

In one or more other non-limiting exemplary embodiments, the logical formula includes a hardware specification for logic circuitry. Some such embodiments further include releasing a corresponding hardware design for fabrication when the automatic theorem proving indicates proper hardware functioning (i.e. in accordance with the specification). The released hardware design can then be released to a foundry and corresponding circuitry can be fabricated and used by one or more end users. Other such embodiments further include updating the hardware specification when the automatic theorem proving indicates improper hardware functioning. The updated specification can then be tested again with the theorem prover and released for production once it is acceptable. Refer, for example, to FIG. 15 as described elsewhere herein.

One or more embodiments repeat the steps of generating the directed acyclic graph, assigning the initial embedding, computing the plurality of initial node states, constructing the cross-dependent embeddings, topologically sorting the directed acyclic graph, computing the layer-by-layer embedding updates, assigning the embedding update for the root node, providing the final embedding, and carrying out the automatic theorem proving are repeated for a plurality of additional logical formulas.

In another aspect, a machine learning system carrying out automatic theorem proving includes a memory 28; and at least one processor 16, coupled to the memory, and operative to improve performance of the machine learning system carrying out automatic theorem proving by narrowing a search space. The at least one processor implements an automatic theorem prover 328. The at least one processor generates, from a logical formula, a directed acyclic graph having a plurality of nodes and a plurality of edges; and assigns an initial embedding to each of the nodes and each of the edges, wherein the initial embeddings assign each of the nodes to one of a plurality of layers and include conjecture node embeddings and premise node embeddings. The at least one processor computes a plurality of initial node states for the nodes by using feed-forward networks; constructs cross-dependent embeddings between the conjecture node embeddings and the premise node embeddings; topologically sorts the directed acyclic graph with the initial embeddings and the initial node states; beginning from a lowest rank obtained in the topologically sorting step, computes layer-by-layer embedding updates for each of the plurality of layers until a root one of the nodes is reached; and assigns the embedding update for the root node as a final embedding for the directed acyclic graph. The final embedding for the directed acyclic graph is provided as input to the automatic theorem prover; and the automatic theorem proving is carried out with the automatic theorem prover implemented on at least one hardware processor based on the input.

In one or more embodiments, the at least one processor is operative to implement a message passing neural network 308 and a graph long short-term memory neural network 310; the logical formula includes a premise formula and a conjecture formula; the steps of generating the directed acyclic graph, assigning the initial embedding, and computing the plurality of initial node states are carried out by the at least one processor with the message passing neural network; and the steps of topologically sorting the directed acyclic graph and computing the layer-by-layer embedding updates are carried out by the at least one processor with the graph long short-term memory neural network.

Figure 14:
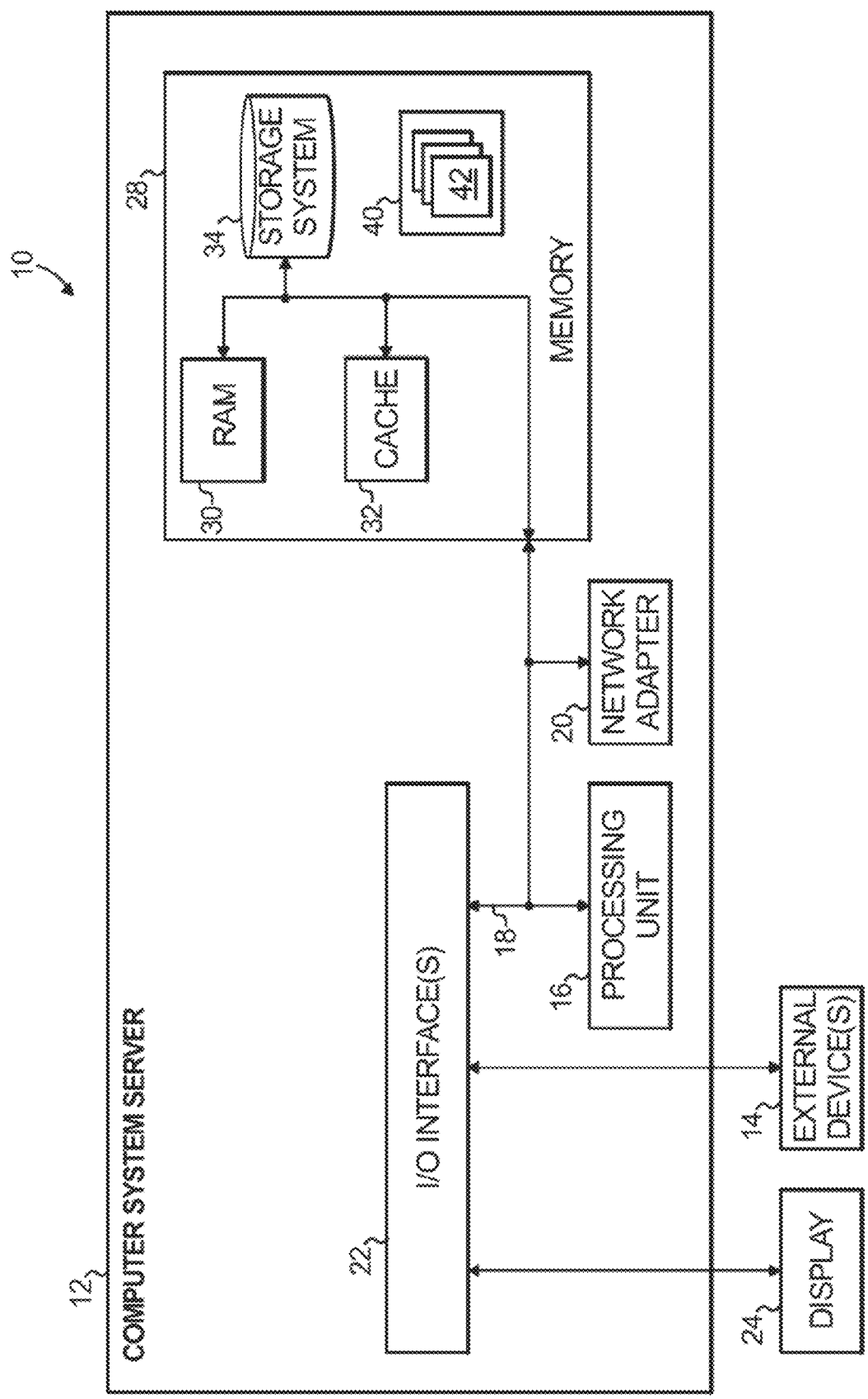
FIG. 14 depicts a computer system that may be useful in implementing one or more aspects and/or elements of the invention, also representative of a cloud computing node according to an embodiment of the present invention.

One or more embodiments of the invention, or elements thereof, can be implemented in the form of an apparatus including a memory and at least one processor that is coupled to the memory and operative to perform exemplary method steps. FIG. 14 depicts a computer system that may be useful in implementing one or more aspects and/or elements of the invention, also representative of a cloud computing node according to an embodiment of the present invention. Referring now to FIG. 14, cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 14, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 14, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 14) running a server program. It will be understood that such a physical server may or may not include a display and keyboard.

One or more embodiments can be at least partially implemented in the context of a cloud or virtual machine environment, although this is exemplary and non-limiting. Reference is made back to FIGS. 1-2 and accompanying text. Consider, e.g., a cloud-based service 96 for capturing the global structure of logical formulae with graph long short-term memory.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 16. Further, a computer program product can include a computer-readable storage medium with code adapted to be implemented to carry out one or more method steps described herein, including the provision of the system with the distinct software modules.

One example of user interface that could be employed in some cases is hypertext markup language (HTML) code served out by a server or the like, to a browser of a computing device of a user. The HTML is parsed by the browser on the user's computing device to create a graphical user interface (GUI).

EXEMPLARY SYSTEM AND ARTICLE OF MANUFACTURE DETAILS

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

EXEMPLARY DESIGN PROCESS USED IN SEMICONDUCTOR DESIGN, MANUFACTURE, AND/OR TEST

One or more embodiments integrate the characterizing and simulating techniques herein with semiconductor integrated circuit design simulation, test, layout, and/or manufacture. In this regard, FIG. 15 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc. Improved latch tree synthesis can be performed as described herein.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of improving performance of a machine learning system carrying out automatic theorem proving by narrowing a search space, said machine learning system being implemented on at least one hardware processor, said method comprising:
   generating, from a logical formula, a directed acyclic graph having a plurality of nodes and a plurality of edges;
   assigning an initial embedding to each of said nodes and each of said edges, wherein said initial embeddings assign each of said nodes to one of a plurality of layers and include conjecture node embeddings and premise node embeddings;
   computing a plurality of initial node states for said nodes by using feed-forward networks;
   constructing cross-dependent embeddings between said conjecture node embeddings and said premise node embeddings;
   topologically sorting said directed acyclic graph with said initial embeddings and said initial node states;
   beginning from a lowest rank obtained in said topologically sorting step, computing layer-by-layer embedding updates for each of said plurality of layers until a root one of said nodes is reached; and
   assigning said embedding update for said root node as a final embedding for said directed acyclic graph;
   providing said final embedding for said directed acyclic graph as input to said machine learning system; and
   carrying out said automatic theorem proving with said machine learning system implemented on at least one hardware processor based on said input.

2. The method of claim 1, wherein:
   in said generating step, said logical formula includes a premise formula and a conjecture formula;
   said steps of generating said directed acyclic graph, assigning said initial embedding, and computing said plurality of initial node states are carried out with a message passing neural network implemented on said at least one hardware processor; and
   said steps of topologically sorting said directed acyclic graph and computing said layer-by-layer embedding updates are carried out with a graph long short-term memory neural network implemented on said at least one hardware processor.

3. The method of claim 2, wherein said cross-dependent embeddings are constructed by concatenation.

4. The method of claim 3, wherein said nodes include premise nodes and conjecture nodes, and wherein said concatenation comprises:
   for a given one of said premise nodes, taking an average of all embeddings of those of said conjecture nodes that are similar and concatenating them to a former embedding of said given one of said premise nodes; and
   for a given one of said conjecture nodes, taking an average of all embeddings of those of said premise nodes that are similar and concatenating them to a former embedding of said given one of said conjecture nodes.

5. The method of claim 4, wherein, in said computing of said layer-by-layer embedding updates, nodes of a same rank have their updates computed simultaneously.

6. The method of claim 2, wherein said logical formula comprises a software specification.

7. The method of claim 6, further comprising releasing corresponding software for use when said automatic theorem proving indicates proper software functioning.

8. The method of claim 6, further comprising rewriting corresponding software when said automatic theorem proving indicates improper software functioning.

9. The method of claim 2, wherein said logical formula comprises a hardware specification for logic circuitry.

10. The method of claim 9, further comprising releasing a corresponding hardware design for fabrication when said automatic theorem proving indicates proper hardware functioning.

11. The method of claim 9, further comprising redesigning corresponding hardware when said automatic theorem proving indicates improper hardware functioning.

12. The method of claim 2, further comprising repeating said steps of generating said directed acyclic graph, assigning said initial embedding, computing said plurality of initial node states, constructing said cross-dependent embeddings, topologically sorting said directed acyclic graph, computing said layer-by-layer embedding updates, assigning said embedding update for said root node, providing said final embedding, and carrying out said automatic theorem proving are repeated for a plurality of additional logical formulas.

13. A non-transitory computer readable medium comprising computer executable instructions which when executed by a computer cause the computer to perform a method of improving performance of a machine learning system carrying out automatic theorem proving by narrowing a search space, the machine learning system being implemented on the computer, the method comprising:
   generating, from a logical formula, a directed acyclic graph having a plurality of nodes and a plurality of edges;
   assigning an initial embedding to each of said nodes and each of said edges, wherein said initial embeddings assign each of said nodes to one of a plurality of layers and include conjecture node embeddings and premise node embeddings;
   computing a plurality of initial node states for said nodes by using feed-forward networks;
   constructing cross-dependent embeddings between said conjecture node embeddings and said premise node embeddings;
   topologically sorting said directed acyclic graph with said initial embeddings and said initial node states;
   beginning from a lowest rank obtained in said topologically sorting step, computing layer-by-layer embedding updates for each of said plurality of layers until a root one of said nodes is reached; and
   assigning said embedding update for said root node as a final embedding for said directed acyclic graph;
   providing said final embedding for said directed acyclic graph as input to said machine learning system; and
   carrying out said automatic theorem proving with said machine learning system implemented on at least one hardware processor based on said input.

14. The non-transitory computer readable medium of claim 13, wherein:
   said instructions, when executed by the computer, cause the computer to implement a message passing neural network and a graph long short-term memory neural network;
   in said generating step of said method, said logical formula includes a premise formula and a conjecture formula;
   said method steps of generating said directed acyclic graph, assigning said initial embedding, and computing said plurality of initial node states are carried out with said message passing neural network; and
   said steps of topologically sorting said directed acyclic graph and computing said layer-by-layer embedding updates are carried out with said graph long short-term memory neural network.

15. The non-transitory computer readable medium of claim 14, wherein said cross-dependent embeddings are constructed by concatenation.

16. A machine learning system carrying out automatic theorem proving, the system comprising:
   a memory; and
   at least one processor, coupled to said memory, and operative to improve performance of the machine learning system carrying out automatic theorem proving by narrowing a search space, by:
      implementing an automatic theorem prover;
      generating, from a logical formula, a directed acyclic graph having a plurality of nodes and a plurality of edges;
      assigning an initial embedding to each of said nodes and each of said edges, wherein said initial embeddings assign each of said nodes to one of a plurality of layers and include conjecture node embeddings and premise node embeddings;
      computing a plurality of initial node states for said nodes by using feed-forward networks;
      constructing cross-dependent embeddings between said conjecture node embeddings and said premise node embeddings;
      topologically sorting said directed acyclic graph with said initial embeddings and said initial node states;
      beginning from a lowest rank obtained in said topologically sorting step, computing layer-by-layer embedding updates for each of said plurality of layers until a root one of said nodes is reached; and
      assigning said embedding update for said root node as a final embedding for said directed acyclic graph;
      providing said final embedding for said directed acyclic graph as input to said automatic theorem prover; and
      carrying out said automatic theorem proving with said automatic theorem prover implemented on at least one hardware processor based on said input.

17. The machine learning system of claim 16, wherein:
   said at least one processor is operative to implement a message passing neural network and a graph long short-term memory neural network;
   said logical formula includes a premise formula and a conjecture formula;
   said steps of generating said directed acyclic graph, assigning said initial embedding, and computing said plurality of initial node states are carried out by said at least one processor with said message passing neural network; and
   said steps of topologically sorting said directed acyclic graph and computing said layer-by-layer embedding updates are carried out by said at least one processor with said graph long short-term memory neural network.

18. The machine learning system of claim 17, wherein said cross-dependent embeddings are constructed by concatenation.

19. The machine learning system of claim 18, wherein said nodes include premise nodes and conjecture nodes, and wherein said concatenation by said at least one processor comprises:
   for a given one of said premise nodes, taking an average of all embeddings of those of said conjecture nodes that are similar and concatenating them to a former embedding of said given one of said premise nodes; and
   for a given one of said conjecture nodes, taking an average of all embeddings of those of said premise nodes that are similar and concatenating them to a former embedding of said given one of said conjecture nodes.

20. The machine learning system of claim 19, wherein, in said computing of said layer-by-layer embedding updates, nodes of a same rank have their updates computed simultaneously.

21. The machine learning system of claim 17, wherein said logical formula comprises a software specification.

22. The machine learning system of claim 17, wherein said logical formula comprises a hardware specification for logic circuitry.

23. The machine learning system of claim 22, wherein said at least one processor is further operative to release a corresponding hardware design for fabrication when said automatic theorem proving indicates proper hardware functioning.

24. The machine learning system of claim 23, wherein said at least one processor is further operative to control semiconductor fabrication equipment to fabricate said corresponding hardware design.

25. The machine learning system of claim 17, wherein said at least one processor is further operative to repeat said steps of generating said directed acyclic graph, assigning said initial embedding, computing said plurality of initial node states, constructing said cross-dependent embeddings, topologically sorting said directed acyclic graph, computing said layer-by-layer embedding updates, assigning said embedding update for said root node, providing said final embedding, and carrying out said automatic theorem proving are repeated for a plurality of additional logical formulas.

* * * * *